(12) United States Patent
Tang

(10) Patent No.: US 8,754,692 B2
(45) Date of Patent: Jun. 17, 2014

(54) LOW POWER AND SOFT ERROR HARDENED DUAL EDGE TRIGGERED FLIP FLOP

(75) Inventor: Bo Tang, Sunnyvale, CA (US)

(73) Assignee: Oracle America, Inc., Redwood City, CA (US)

(*) Notice: Subject to any disclaimer, the term of this patent is extended or adjusted under 35 U.S.C. 154(b) by 1071 days.

(21) Appl. No.: 12/204,004

(22) Filed: Sep. 4, 2008

(65) Prior Publication Data

US 2010/0052756 A1   Mar. 4, 2010

(51) Int. Cl.
*H03K 3/289* (2006.01)
*H03K 3/3562* (2006.01)

(52) U.S. Cl.
CPC .................... *H03K 3/35625* (2013.01)
USPC ........................................... 327/203

(58) Field of Classification Search
USPC ......... 327/208, 210, 211, 212, 214, 215, 218, 327/199–203
See application file for complete search history.

(56) References Cited

U.S. PATENT DOCUMENTS

| | | | | |
|---|---|---|---|---|
| 4,629,909 A * | 12/1986 | Cameron | ....................... | 327/211 |
| 5,025,174 A * | 6/1991 | Shikata | ......................... | 327/203 |
| 5,751,174 A * | 5/1998 | Kuo et al. | ..................... | 327/199 |
| 6,026,011 A * | 2/2000 | Zhang | ............................ | 365/154 |
| 6,310,500 B1 * | 10/2001 | Varma | ............................ | 327/211 |
| 7,082,560 B2 * | 7/2006 | Parulkar et al. | ............... | 714/726 |
| 7,109,776 B2 * | 9/2006 | Tschanz et al. | ............... | 327/298 |
| 7,233,184 B1 * | 6/2007 | Nguyen | ........................ | 327/199 |
| 7,388,417 B2 * | 6/2008 | Kim et al. | ..................... | 327/403 |
| 7,456,669 B2 * | 11/2008 | Teh et al. | ........................ | 327/218 |
| 7,562,316 B2 * | 7/2009 | Tschanz et al. | .................... | 716/1 |
| 7,710,153 B1 * | 5/2010 | Masleid et al. | ................... | 326/82 |
| 2004/0150449 A1 | 8/2004 | Durham et al. | | |

* cited by examiner

*Primary Examiner* — Sibin Chen
(74) *Attorney, Agent, or Firm* — Brooks Kushman P.C.

(57) ABSTRACT

A dual edge triggered flip flop can pass data values on a clock rising or falling edge. The dual edge triggered flip flop can be operated at half the clock speed of a single edge triggered flip flop and produce substantially the same throughput. The dual edge triggered flip flop may use less power than a single edge triggered flip flop due at least in part to the construction of an intermediate gate as a data interlock gate. The dual edge triggered flip flop may contain a plurality of master nodes, and is soft error hardened compared to a single edge triggered flip flop.

1 Claim, 2 Drawing Sheets

LOW POWER AND SOFT ERROR HARDENED DUAL EDGE TRIGGERED FLIP FLOP

TECHNOLOGICAL FIELD

The illustrative embodiments generally relate to edge triggered flip flops. More specifically, the illustrative embodiment relate to flip flops triggered on both the rising and falling edge of the clock signal, or dual edge triggered flip flops having low power consumption.

BACKGROUND AND SUMMARY

Power consumption caused by clock signals has always been a significant factor in a chip's overall power consumption. Naturally, as processor speeds continue to increase, power demands produced by those processors increase as well. Clock power, combined with a sequential element such as a flip flop can account for over sixty percent of a chip's power consumption. Thus, if the clock increases in frequency by twenty percent, a chip using the newer, faster frequency can consume, for example, approximately ten percent more power.

Many common flip flops are single edge triggered flip flops, and are triggered on the rising or falling edge of the clock signal. One example of a single edge flip flop is shown in FIG. 1.

The flip flop shown in FIG. 1 is triggered on the rising edge of the clock. When clk signal 101 is low, gate 109 is open and d 109 values can pass freely into the master node. The inversion of the clk signal at gate 105 makes a low clock value high, activating MOSFET transistor 109a. The twice inversion of the clk signal at gates 105, 107 and at MOSFET transistor 109b activates transistor 109b as well. When both transistors 109a and 109b are active, the signal d can pass through gate 109.

After passing through gate 109, the signal d is sent to a master gate 117 and to a feedback loop 115. The signal is twice inverted before reaching each destination. If the signal d is high, then MOSFET transistor 111a is not active, since there is an inverter which will drive the signal low. Consequently, no high signal from power source 112 can pass through gate 111 as feedback, regardless of the state of MOSFET transistor 111b.

At the same time, MOSFET transistor 113b is active, so a low signal from ground 114 can pass through gate 113 as feedback if MOSFET transistor 113a is also active. When the clock is low, as in the present example, both transistors 111b and 113a are inactive.

Finally, during the clock low period, MOSFET transistors 117a and 117b are also inactive, closing gate 117 and preventing passthrough of the inverted d signal. The slave gate 119 is open, because MOSFET transistors 119a and 119b are both active, but the d signal is not being passed at this time and so the slave node retains its previous value. The slave value is also passed to q_1 after being inverted.

When the clk signal goes from low to high, several events occur. First, the gate 109 is closed, preventing passthrough of the d signal to the master node. Now the value of the master node is determined by the feedback loop 115, and is driven by the previous value of d. Since d was last passed as high, transistor 111a is still inactive, and transistor 113b is active. Transistors 111b and 113a are now also active, and the pairing of active transistors 113a and 113b opens gate 113 so that the low ground signal can pass through (which corresponds to the inverted high d signal previously being passed). Thus, the master node is storing the proper previously passed d signal, and changes to d cannot propagate to the master node.

In addition to closing gate 109, the changing of the clock from low to high opens gate 117, by activating transistors 117a and 117b. At the same time, gate 119 is closed and the signal stored by the master node feedback loop is passed to both q_1 (after being inverted once more).

Finally, when the clock toggles back from high to low, gate 109 is opened again, allowing new d signals to pass through, but gate 117 is closed, so the new d signal will not reach q_1 until the next rising edge. Slave node 121 is also now set with the previously passed d signal, since gate 119 is again opened.

Since the flip flop is triggered on the rising edge, the d signal can only pass through once per clock cycle. If flip flops could be triggered on both the rising and falling edge, however, then a frequency of ½ the standard frequency would produce similar power consumption and throughput results with a dual edge triggered flip flop as would a standard frequency in combination with a single edge triggered flip flop.

Dual edge triggered flip flops may, however, require more power consumption from the flip flop itself, to realize the dual edge triggering. Further, flip flops are often susceptible to "soft error." Soft errors in chips can be caused by the presence of unwanted alpha particles or other unwanted energy resulting from material decay or cosmic rays (other causes of soft errors also exist). When such unwanted energy is present, it can disturb the electron distribution in the semiconductor, and, if present in large enough quantity, it can even flip a binary 0 to a 1 and vice-versa.

In the single edge flip flop shown, a soft error at just about any location during any clock cycle could cause an unknown state to occur. For example, if the error occurred in the master node during clock high, the master node value could be flipped and the wrong value could be passed as a result. If the soft error occurred in the slave node during clock low, again, the value 1 could be flipped and the wrong value could be stored by the slave. Since these nodes are driven by feedback, any soft error can disrupt the feedback and cause a change in value.

The illustrative embodiments provide dual edge triggered flip flops which are capable of lower power consumption, operation at lower clock frequencies with the same performance throughput as single edge flip flops at higher clock frequencies which can help reducing clock delivery power consumption as well, and/or which are soft error hardened to resist soft errors.

In one or more illustrative embodiments, the design of a dual edge triggered flip flop is such that the components themselves draw less power than a traditional single edge triggered flip flop, reducing power consumption of the flip flop itself.

In at least one illustrative embodiment, dual edge triggered flip flop further can be operated at approximately 50% clock frequency. Operating the flip flop at 50% clock frequency produces approximately the same performance as operating a single edge triggered flip flop at 100% clock frequency in conjunction with the same processor.

According to one or more illustrative embodiments, a dual edge triggered flip flop is also hardened against soft error. In at least one illustrative embodiment, a locking middle stage design provides such hardening. In this embodiment, when both master nodes have the same value which is true at roughly 90% time for microprocessor application, a soft error to one of two master nodes will cause the middle stage to lock and thus cause no change, and a soft error to the slave node may be driven out by the correct data in the master nodes. Thus the soft error rate will be reduced significantly.

BRIEF DESCRIPTION OF THE DRAWINGS

Other objects, aspects and characteristics of the illustrative embodiments will become apparent from the following detailed description of exemplary embodiments, when read in view of the accompanying drawings, in which.

DETAILED DESCRIPTION OF ILLUSTRATIVE EMBODIMENTS

The present invention is described herein in the context of particular exemplary illustrative embodiments. However, it will be recognized by those of ordinary skill in the art that modification, extensions and changes to the disclosed exemplary illustrative embodiments may be made without departing from the true scope and spirit of the instant invention. In short, the following descriptions are provided by way of example only, and the present invention is not limited to the particular illustrative embodiment disclosed herein.

Figure 2:
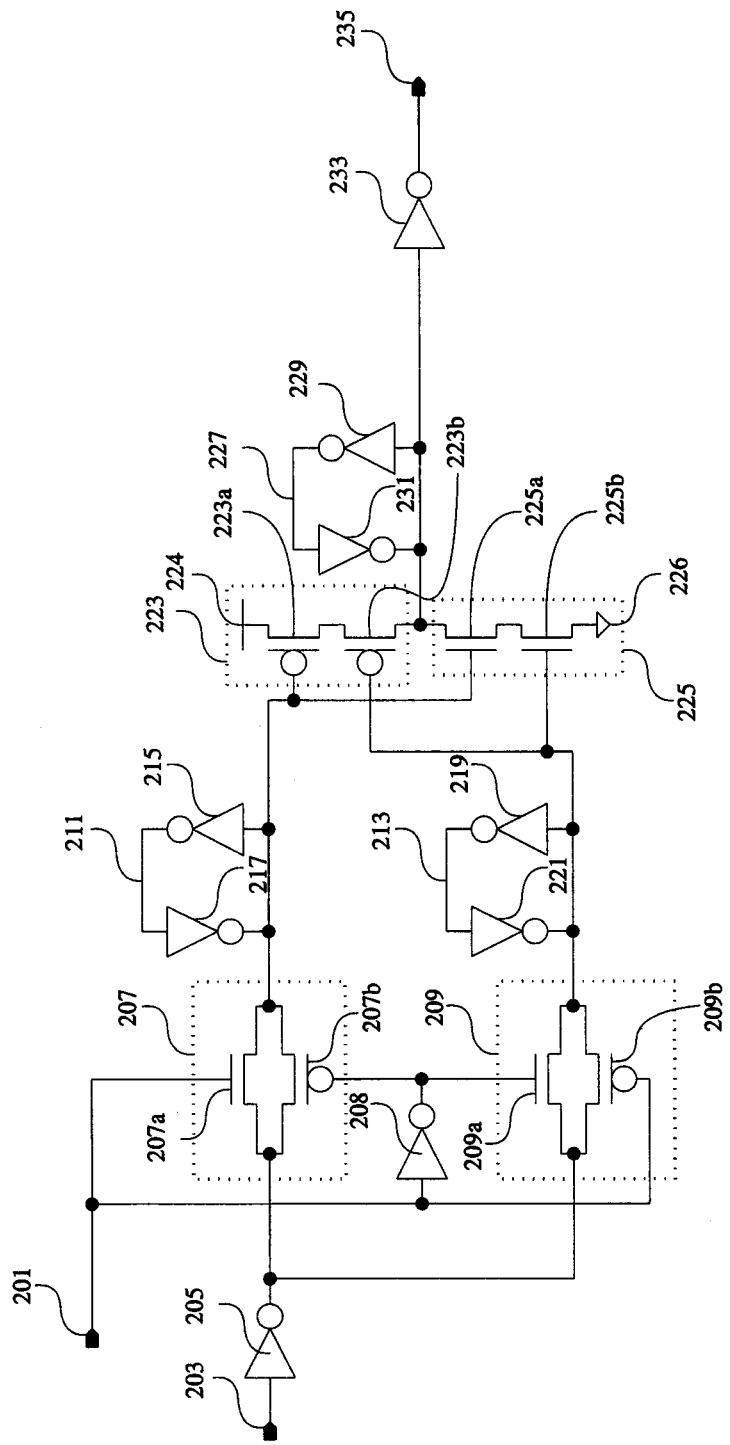
FIG. 2 shows an exemplary illustrative dual edge triggered flip flop.

FIG. 2 shows an exemplary illustrative non-limiting dual edge flip flop. In this illustrative example, a clock signal (clk) 201 and a data signal (d) 203 are provided as inputs the flip flop. Data signal d is inverted at inverter 205 before being passed into one of the master nodes 211,213. For purposes of this explanation, it will be assumed that data signal d starts high.

While the clk signal is low, transistors 207a and 207b are inactive, and signal d cannot pass through gate 207. Also, while the clk signal is low, transistor 209a is active because the signal is inverted at inverter 208, and transistor 209b is active because the signal is inverted at the transistor. Hence, gate 209 is open and signal d can pass through gate 209.

After the signal passes through gate 209, it is stored in second master node 213. This node comprises two inverters 219 and 221. This is the second of two master nodes in this illustrative embodiment.

In addition to being stored in the second master node, the data signal d is also passed to transistors 223 b (where it is inverted) and 225b. In this case, because data signal d is low (having been inverted at inverter 205), transistor 223b is active (the signal is inverted back 7 high) and transistor 225b is inactive.

Since the state of the first master node has not yet been established in this example, we will assume, for the purposes of this example, that the first master node had previously stored a high value, and thus gate 223a is inactive (the high signal being inverted) and gate 225a is active. Since no pairing of gates (223a/223b; or 225a/225b) is active, both gates 223,225 are closed. Accordingly, no signal is presently being passed to slave node 227. This is appropriate, because the first master node is presently storing a high signal and the second master node is presently storing a low signal.

As the clock transitions from low to high, it will be assumed, for the purpose of this explanation, that data signal d remains unchanged(high), signaling that the system wishes propagate the high signal as d for this clock edge.

Once the clock is high, gate 207 is opened, as transistor 207a is activated and transistor 207b is activated (since clk signal is twice inverted, at inverter 208 and at the transistor). Additionally, transistor 209a and transistor 209b are both now inactive, so gate 209 is closed. Thus, the second master node is now unable to receive changes in d, and will instead store the previously stored value until gate 209 reopens.

Since gate 207 is now open, signal d can now pass to the first master node. As characterized as hold time, signal d needs to keep its high for a certain time after the clock rising edge. As d is a high signal that has been inverted at inverter 205, a low signal is passed to the first master node 211. As with the second master node 213, the first master node is comprised of two inverters 215, 217.

The low signal is also passed to transistor 223a, where it is inverted, activating that transistor. At the same time, transistor 223b is being passed the previously stored low signal from the second master node, and that signal is also inverted, activating that transistor. Accordingly, gate 223 is now open.

Transistor 225a also receives the signal from the first master node, but the signal is not inverted. Resultantly, gate 225 is closed, since both transistors 225a, 225b are inactive. Since gate 223 is open, power (or a high signal) passes from 224 to slave node 227. Slave node 227 also comprised of two inverters and stores the value passed to it. The high signal passed through is the same as the data signal d (both high) and so the appropriate signal has now been passed. The signal is finally inverted at inverter 233 and passed to q_1 235.

Now it will be assumed that the data signal d shifts to low during the high phase of the clock cycle. Since gate 207 is still open, the inverted data signal d (high after inversion) is passed through gate 207 to the first master node. At this point, the first master node is storing a high signal and the second master node is storing a low signal. Since the first master node is now storing a high signal, transistor 223a is now inactive and transistor 225a is now active, and both gates are then closed (because transistor 223b is active and transistor 225b is inactive). Accordingly, no signal is being passed to slave node 227, and the slave node then continues to store the last high signal passed to it.

Finally, when the clock falls from high to low (the trailing edge), it is assumed that the data signal remains low for a certain time which is characterized as flop hold time, indicating that the system wants to pass a low signal. Gate 207 is closed and gate 209 is opened, in accordance with the low clock signal. The inverted data signal d (high after inversion) is passed to the second master node.

Now both master nodes store a low data signal. Also, gate 223 is now closed, since both high data signals stored in the master nodes are inverted at transistors 223a and 223b. Gate 225, however, is now open, as the high signals stored in both master nodes are supplied to the transistors 225a and 225b. Accordingly, the ground (or low) signal 226 is allowed to pass through gate 225 to slave node 227. The signal is also inverted and passed to q_1.

This is one illustrative example of a dual edge triggered flip flop that can pass data signals at twice the rate of a single edge triggered flip flop. As can be seen, the data passes on the rising or falling edge of the clock signal. Accordingly, if a manufacturer desires to save power, the clock can be run at half the frequency as a clock using single edge triggered flip flops and still pass the same amount of data, for a significant power savings. The power savings on the clock delivery trees and grids could be, for example, 50% in such a case.

Figure 1:
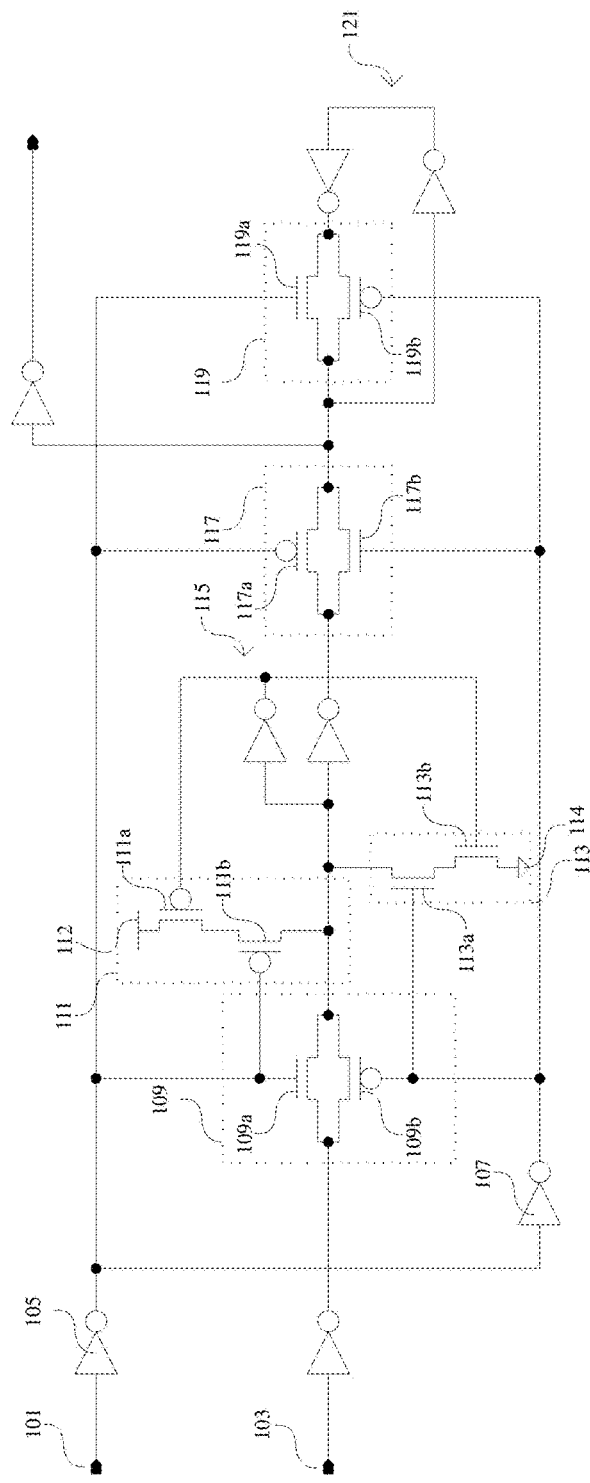
FIG. 1 shows an exemplary single edge triggered prior art flip flop.

In addition to faster passing of data, this exemplary dual edge triggered flip flop also has further power saving gains over the exemplary FIG. 1 single edge triggered flip flop. In the single edge triggered flip flop, the middle gate 117 has a significant gain requirement and thus has a large clock node. In the exemplary FIG. 2 flip flop, although two clock gated latches 207, 209 are provided in front of the master nodes, the gates are in parallel and thus can use smaller transistors. In this flip flop, the middle stage is a data interlocking design, which does not have any clock gating devices at all and realizes power consumption advantages because clock node capacitance contributes much more power consumption due to its 100% activity factor (toggles every clock cycle) than normal data node which toggles 25% theoretically. In fact, in real application statistics, the data toggling rate may even be less than 10%.

The exemplary dual edge triggered flip flop also has advantages in soft error reduction. If the soft error occurs when both master nodes are holding the same value, then the passthrough gates 223, 225 will lock, and the invalid value will not pass. If the soft error occurs on the slave node at this time, then the master nodes will drive the value back to the correct value.

If the data has changed before a clock change, then the propagation of a soft error depends on which master node registers the change. If it is the master node that is currently receiving the d signal, the change will only cause the propagation of the previously sent signal, stored in slave already, and cause no lasting problem as the d signal driven to the master node will correct the change. If the change occurs in the node which is not receiving the d signal, the change can cause an early propagation of the d signal, which may cause a problem. Similarly, once the new d signal is received by one of the two master nodes, a change to the slave node will not be corrected until the clock signal changes. However, as mentioned earlier, the probability of such case may be less than 10% in real application statistics.

Although the dual edge triggered flip flop is not perfect at removing soft error, it does reduce the impact soft error has on the overall system, since both master nodes must be matched to propagate a signal. This hardened design could help significantly reduce soft error rate on clocked elements. As the incidence of soft error becomes a greater and greater concern as transistors get smaller and smaller, soft error rate reduction in circuit design becomes more and more important.

It is also noted that numerous inverters are present in the illustrative embodiment. Addition or removal of inverters is contemplated, and will not affect the scope of the invention. For example, if the operation of gates 223 and 225 were reversed, and another inverter was added before or after inverter 233, the output result would be the same. Similarly, addition or removal of inverters at other points in the circuit will not necessarily substantially change the result of the circuit.

It is to be understood that the present invention is not to be limited to the disclosed exemplary illustrative non-limiting implementations. On the contrary, the present invention is intended to cover various modifications and equivalent arrangements included within the scope of the claims.

What is claimed is:

1. A flip-flop apparatus comprising:
    a first and second data transfer gate, wherein the first data transfer gate is operable to open when a clock signal is high, and the second data transfer gate is operable to open when the clock signal is low, the data transfer gates comprising a pair of transistors, wherein the data transfer gates are operable to pass a data value along an input to a respective first and second storage node when the respective first and second data transfer gates are open;
    wherein each of the first and second storage nodes are comprised of a pair of inverters coupled in series in a feedback loop, such that the output of a first inverter of the pair of inverters is coupled to the input of a second inverter of the pair of inverters, and the output of the second inverter is coupled to the input of the first inverter,
    wherein the input to each storage node is also coupled to the input of the first inverter and the output of the second inverter, and is further coupled to an output line from the storage node to a first and second pass-through gate,
    wherein the output line from each storage node is operable to provide an output value to the first pass-through gate and an inverted output value to the second pass-through gate; and
    wherein the pass-through gates are operable to open to pass a value to a data output when the output lines from both storage nodes provide the same value, wherein the first pass-through gate is operable to open if both storage nodes are storing a high value, and wherein the second pass-through gate is operable to open if both storage nodes are storing a low value, wherein both pass-through gates operate independent of a value of the clock signal.

* * * * *